United States Patent
Barker et al.

(10) Patent No.: US 7,007,125 B2
(45) Date of Patent: Feb. 28, 2006

(54) PASS THROUGH CIRCUIT FOR REDUCED MEMORY LATENCY IN A MULTIPROCESSOR SYSTEM

(75) Inventors: John Howard Barker, Rougemont, NC (US); Beeman Noel Fallwell, Jr., Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 463 days.

(21) Appl. No.: 10/602,222

(22) Filed: Jun. 24, 2003

(65) Prior Publication Data

US 2004/0268000 A1    Dec. 30, 2004

(51) Int. Cl.
*H05F 7/10*    (2006.01)

(52) U.S. Cl. .................................... 710/301
(58) Field of Classification Search ................ 710/301
See application file for complete search history.

(56) References Cited

U.S. PATENT DOCUMENTS

| | | | |
|---|---|---|---|
| 4,875,154 A | 10/1989 | Mitchell | |
| 5,384,692 A | 1/1995 | Jaff | |
| 5,710,733 A | 1/1998 | Chengson et al. | |
| 5,748,912 A | 5/1998 | Lee | |
| 5,835,357 A | 11/1998 | Swamy et al. | |
| 5,867,419 A | 2/1999 | Chengson et al. | |
| 5,987,553 A | 11/1999 | Swamy et al. | |
| 6,092,134 A | 7/2000 | Chun et al. | |
| 6,122,695 A | 9/2000 | Cronin | |
| 6,128,685 A | 10/2000 | Cronin | |
| 6,266,252 B1 | 7/2001 | Karabatsos | |
| 6,532,546 B1 | 3/2003 | Sanders et al. | |
| 6,539,449 B1 | 3/2003 | Leddige et al. | |

*Primary Examiner*—Rehana Perveen
*Assistant Examiner*—Christopher Daley
(74) *Attorney, Agent, or Firm*—Joseph P. Lally; Martin J. McKinley

(57) ABSTRACT

A technique and mechanism for reducing memory latency asymmetry in a multiprocessor system by replacing one (or more) processors with a bypass or pass-through device. Using the pass-through mechanism, the reduced number of processors in the system enables all of the remaining processors to connect to each other directly using the interconnect links. The reduction in processor count improves symmetry and reduces overall latency thereby potentially improving performance of certain applications despite having fewer processors. In one specific implementation, the pass through device is used to connect two HyperTransport links together where each of the links is connected to a processor at the other end.

17 Claims, 4 Drawing Sheets

PASS THROUGH CIRCUIT FOR REDUCED MEMORY LATENCY IN A MULTIPROCESSOR SYSTEM

BACKGROUND

1. Field of the Present Invention

The present invention is in the field of data processing systems and more particularly a distributed memory multiprocessor system with asymmetric latency.

2. History of Related Art

Multiprocessor data processing systems are well known. In perhaps the most widely implemented multiprocessor system, multiple processors share equal access to a common system memory over a shared bus. This type of system is generally referred to as a symmetric multiprocessor system (SMP) to emphasize that the memory latency is substantially independent of the processor. While symmetric memory latency is a desirable attribute, SMP systems are limited by the finite bandwidth of the shared bus connecting each of the processors to the system memory. This bandwidth bottleneck typically limits the number of processors that can be advantageously attached to the shared bus.

Attempts to overcome the limitations of SMP systems have resulted in distributed memory multiprocessor systems. In one implementation of such a system, each of a set of processors has its own local system memory and each of the processors is interconnected to the other processors so that each processor has "remote" access to the system memory of the other processors. Recently, one implementation of this type of configuration has employed the HyperTransport link between processors. The HyperTransport is a point-to-point interconnect technology that uses unidirectional, low voltage differential swing signaling on data and command signals to achieve high data rates. Additional descriptions of HyperTransport are available from the HyperTransport consortium (hypertransport.org).

As their name implies, point-to-point technologies require dedicated ports on each of the connected pair of devices. In a multiprocessor configuration this dedicated port requirement can quickly add pin count to the design. The narrowest implementation of HyperTransport, for example, requires 16 pins/link (plus power pins) while the widest (fastest) implementation requires 148 pins/link (plus power pins). Because it is undesirable to have large pin counts, the number of point-to-point links that any processor can accommodate is effectively limited. This limitation can have a negative impact on the performance benefits achievable when a design is scaled. Specifically, if the number of point-to-point link ports on each processor in the design is insufficient to connect each processor directly to each other processor, the memory access asymmetry increases because some memory accesses must traverse more than one point-to-point link. As a result, the memory access latency for these indirect memory accesses is higher. If a particular, memory-intensive application generates a disproportionate number of indirect memory accesses, the higher latency may result in lower overall performance. It would be desirable to implement a solution to the memory latency problem caused by indirect accesses in a distributed memory multiprocessor system employing point-to-point processor interconnects.

SUMMARY OF THE INVENTION

The problem identified is addressed by a technique and mechanism for reducing memory latency asymmetry in a multiprocessor system by replacing one (or more) processors with a bypass or pass-through device. Using the pass-through mechanism, the reduced number of processors in the system enables all of the remaining processors to connect to each other directly using the interconnect links. The reduction in processor count improves symmetry and reduces overall latency thereby potentially improving performance of certain applications despite having fewer processors. In one specific implementation, the pass through device is used to connect two HyperTransport links together where each of the links is connected to a processor at the other end.

In one embodiment, the invention is implemented as a system having a set of processors, a system board having a set of sockets, a set of interconnects, and a pass through device. Each socket may receive one of the processors. The number of sockets in the set of sockets exceeds the number of processors in the set of processors by at least one. The interconnects provide point-to-point links between at least some of the sockets. The pass through device occupies one of the sockets to connect a first interconnect link connected to the socket and a second interconnect link such that the first and second interconnect links form the functional equivalent of a single interconnect link.

BRIEF DESCRIPTION OF THE DRAWINGS

Other objects and advantages of the invention will become apparent upon reading the following detailed description and upon reference to the accompanying drawings in which.

Figure 1:
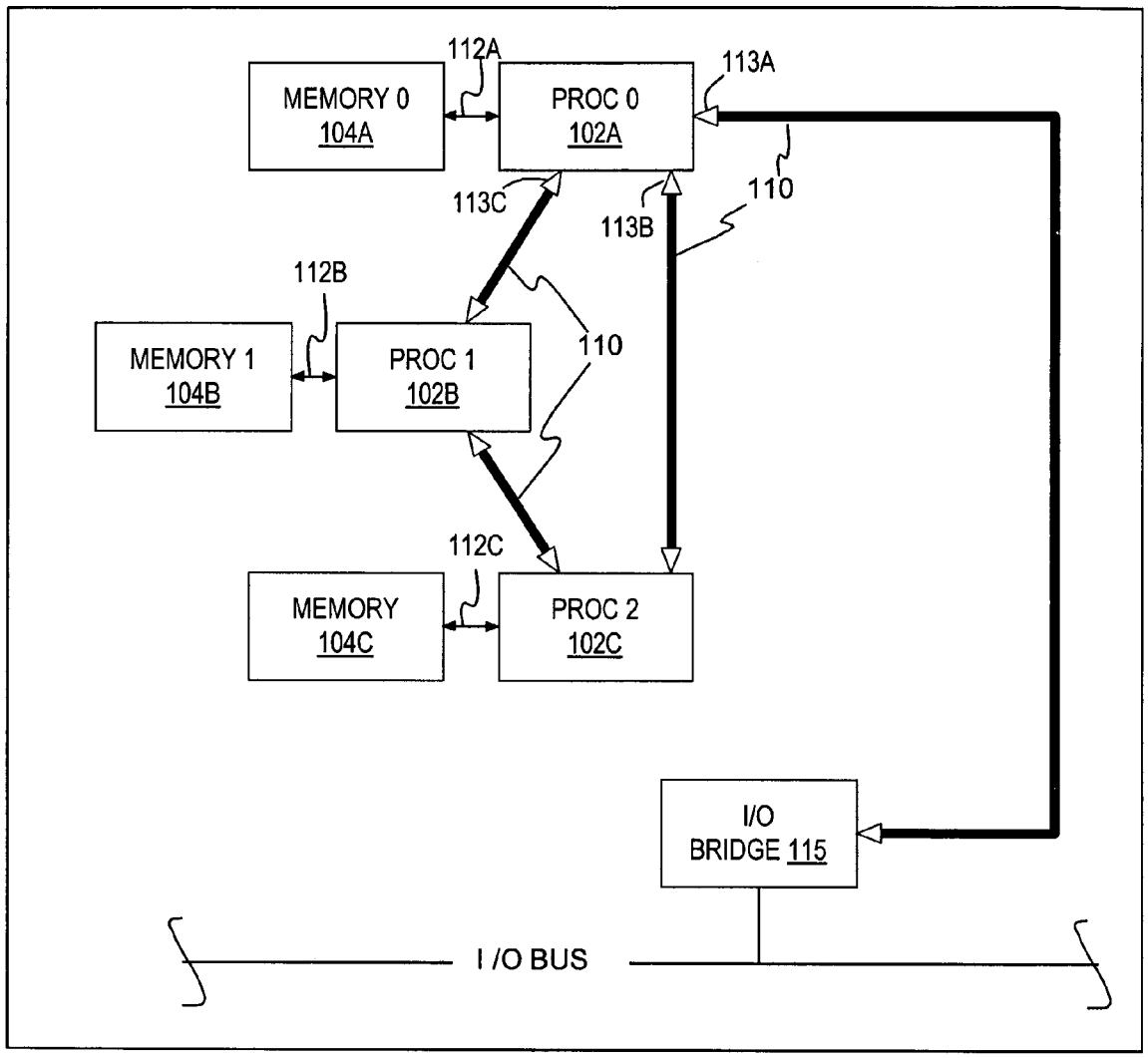
FIG. 1 is a block diagram of a 3-way multiprocessor system using a point-to-point interconnect.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the invention includes a mechanism for optimizing performance of a multiprocessor system under circumstances when memory asymmetry associated with the system results in degraded performance. The mechanism reduces asymmetry by replacing one (or more) processors with a bypass or pass-through device. Using the pass-through mechanism, the reduced number of processors in the system enables all of the remaining processors to connect to each other directly using the interconnect links. The reduction in processor count improves symmetry and reduces overall latency thereby potentially improving performance of certain applications despite having fewer processors.

Referring now to the drawings, FIG. 1 illustrates selected elements of a multiprocessor system 100A exhibiting desirable symmetry. System 100A is illustrated to provide a point of comparison for the subsequent discussion of a similar system having additional processors. System 100A includes three general purposes microprocessors 102A, 102B, and 102C (generically or collectively referred to herein as processor(s) 102). Processors 102A, 102B, and 102C are each connected to a corresponding system memory 104A, 104B, and 104C (generically or collectively referred to as system memory/memories 104) over a corresponding memory bus 112A, 112B, and 112C (generically or collectively-memory bus/busses 112).

System 100A implements a point-to-point link technology to interconnect processors 102. Specifically, each processor 102 is connected to the other two processors via a point-to-point link 110 between the corresponding pair of processors. In addition, processor 102A is connected to an I/O bridge via another instance of link 110. Thus, processor 102A includes a set of three link ports 113A, 113B, and 113C to accommodate the links to processors 102B and 102C and I/O bridge 115. Similarly, processors 102B and 102C each have at least two link ports to support the connections to the other two processors 102.

As configured in FIG. 1, system 100A may be characterized as having two-tiered memory latency. The first tier of latency represents the latency that occurs when a processor 102 accesses it own "local" system memory 104 over its memory bus 112. The second tier of latency represents the latency when a processor such as processor 102A accesses "remote" system memory, namely, the system memories 104B and 104C. The second tier of latency is clearly higher (slower) than the first tier because a second tier access must traverse a link 110 in addition to a memory bus 112 while a first tier access only traverses a memory bus 112.

Although system 100A exhibits asymmetric memory access due to this tiered latency effect, the additional latency is minimized because each processor 102 has a direct link to each other processor. In this configuration, under idealized random memory access pattern, one would expect that ⅔ of memory accesses incur the second tier of latency while ⅓ exhibit the first tier only. While these statistics suggest that the overall memory latency of system 100A is probably higher than the memory latency of a truly symmetric multiprocessor system, system 100A represents the best achievable latency within the distributed memory paradigm because not all processors 102 are within one "hop" of all system memory 104.

Figure 2:
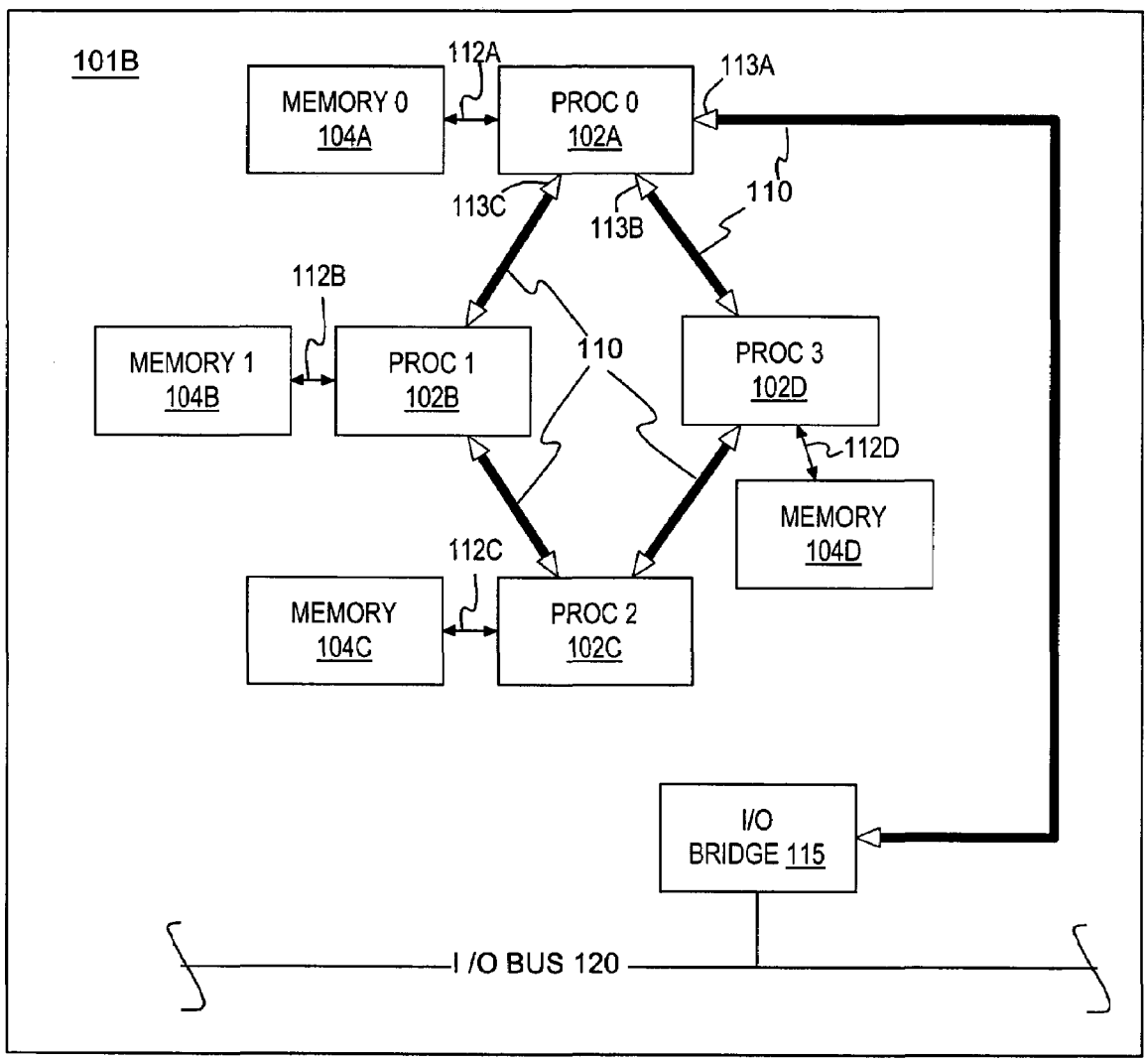
FIG. 2 is a block diagram of a 4-way multiprocessor system using a point-to-point interconnect technology and three interconnect link ports per processor.

Referring now to FIG. 2, a system 100B is depicted to illustrate a potential problem of distributed memory systems used in conjunction with point-to-point interconnect technology. System 100B includes all the elements of system 100A and, in addition, includes a fourth processor 102D. As described earlier, each processor 102 is constrained by pin count, die size and other considerations in the number of point-to-point links it can support. For purposes of this disclosure, it is assumed that the maximum number of interconnect link ports 113 each processor 102 has is three.

With only three link ports 113, the latency tiering of systems having more than three processors increases beyond two. Processor 102A cannot connect directly to each of the other three processors 102 and to the I/O bridge 115. Instead, the four-way configuration of system 100B is achieved by connecting processor 102A to processors 102B and 102D and to I/O bridge 115. This design leaves processor 102A without a direct link to processor 102C. Similarly, processors 102B and 102D are shown as lacking a direct link between them. One will appreciate that system 100B as depicted exhibits three-tiered latency, namely, a first tier latency representing direct memory accesses (accesses from a processor 102 to its local system memory 104), a second tier latency representing "one hop" memory accesses, and a third tier latency representing two hop accesses. In the depicted system 100B, the third tier latency occurs when, as an example, processor 102A accesses system memory 104C and vice versa.

Although the implementation specifics of a four- (or more) way system such as system 100B can vary, no design can accommodate direct links between each pair of processors if the number of link ports on any processor is less than the number of other processors in the system. Moreover, if at least one of the processors must support a direct link to the system's peripheral devices via I/O bridge 115 or a similar device, the number of link ports (on at least one of the processors) must exceed the number of other processors in the system to achieve two tiered memory latency by directly linking each processor with each other processor.

System 100B as depicted in FIG. 2 is representative of at least some commercially available multiprocessor system designs. In one specific example, a multiprocessor system employing a set of four (or more) Opteron® MP processors from Advanced Micro Devices is configured as depicted in FIG. 2. In this implementation, the point-to-point links 110 represent the HyperTransport links described above. In such systems, the system board 101B to which the processors are attached includes sockets for each of the four processors 102 and the configuration is, therefore, relatively inflexible. While a customer in possession of the four-way system 100B can convert the system to a three-way system 100A by removing processor 102B, 102C, or 102D, the resulting system will still exhibit three-tiered latency.

The three-tiered memory latency characteristics of system 100B, however, may actually result in degraded overall system performance depending upon the specific application or applications that are executing on the system. If system 100B is executing one or more memory intensive applications and the memory access patterns are more or less random, or worse, biased toward one hop and two hop accesses, the increased latency of the one hop and two hop accesses can result in slower performance than the same applications running on system 100A would exhibit.

Figure 3:
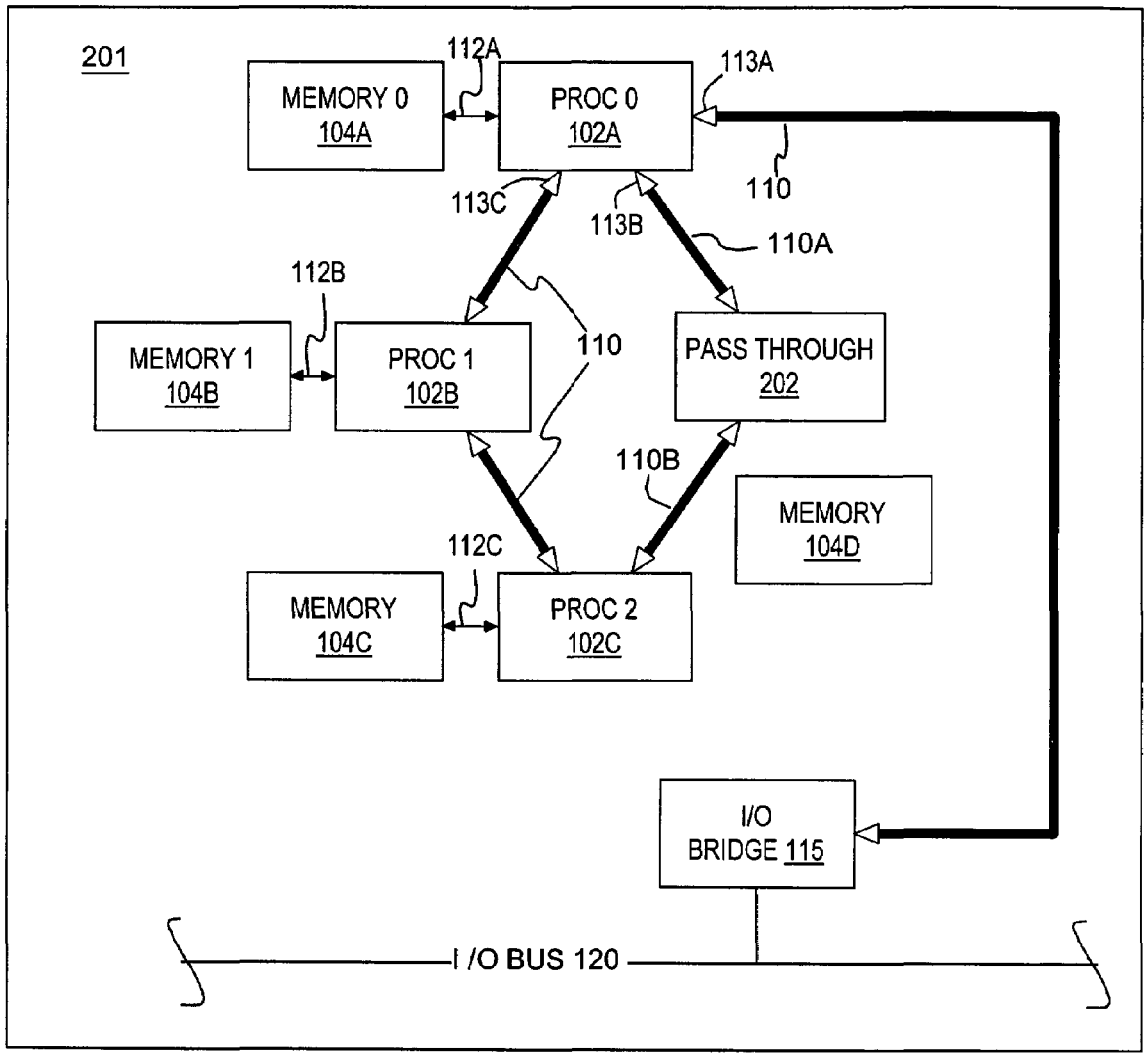
FIG. 3 is a block diagram of a 3-way multiprocessor system produced by replacing one of the four processors of FIG. 2 with a bypass mechanism.

The present invention addresses this problem by enabling the conversion of a multiprocessor system characterized by three-tiered latency to a multiprocessor system exhibiting two-tiered latency. Specifically, as depicted in FIG. 3, a system 200 according to one embodiment of the present invention employs a system board 201 capable of accommodating N processors 102, each with its own local memory 104 (where N is equal to 4 in the illustrated example). Each processor 102 as described above includes a set of "M" link ports 113 enabling the processor to connect directly to "M" other devices including other processors 102 and/or I/O bridge 115. When "M" is less than "N", it is not possible to achieve system wide two-tiered latency (assuming that at least one link port must be dedicated to I/O). When two-tiered latency is a more desirable objective than N-way processing capability, a pass through device 202 is employed in lieu of one of the processors 102.

Figure 4:
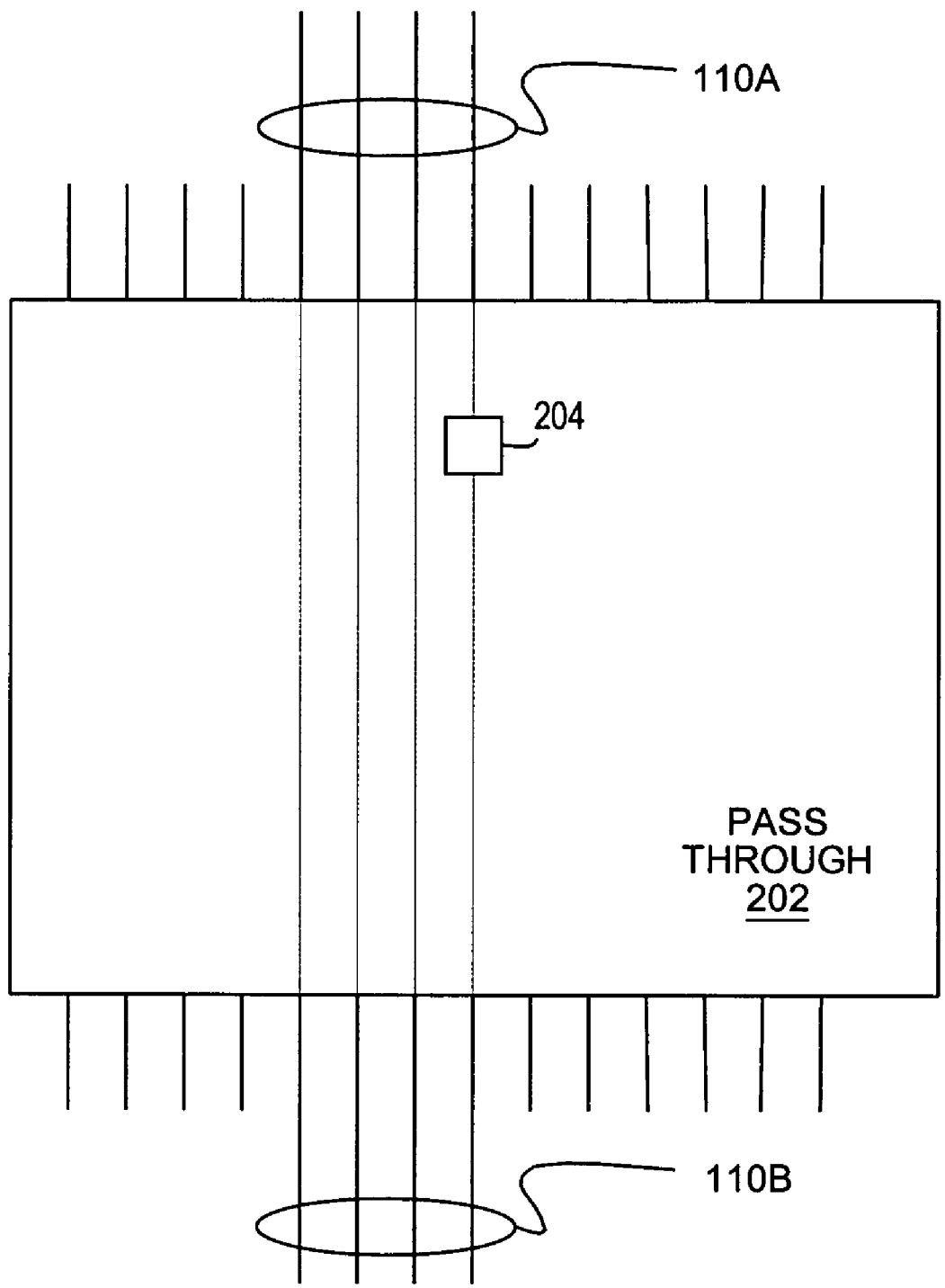
FIG. 4 is a representational depiction of the bypass circuit of FIG. 3 according to one embodiment of the present invention.

Pass through device 202, as conceptually depicted in FIG. 4, is implemented as a circuit board or integrated circuit package having a pin out configuration that is the same as the pin out of processors 102 so that the pass through device 202 can be inserted into the socket designed for processors 102D (or one of the other processors in a different implementation). Pass through device 202, as its name implies, includes wiring that connects two of the point-to-point links 110. As depicted in FIG. 4, for example, the wiring of pass through device 202 provides a direct connection between a first instance of the point-to-point link (reference numeral 110A) and a second instance of the point-to-point link (reference numeral 110B). In some embodiments, pass through device 202 incorporates buffering or driver circuitry 204 (shown in FIG. 4 on just a single link signal although, in practice, driver circuits, when employed, would likely be used on each data and command link signal) to boost the link signals while, in other embodiments, the pass through device 202 comprises straight wiring to provide a truly direct connection between the corresponding pair of links 110. In one embodiment that is significant with respect to currently available systems, pass through device 202 provides a pass-through connection between two HyperTransport links.

With the pass through device 202 in place in system board 201, processor 102A is now directly connected to processor 102C (through the intervening pass through 202) and two-tiered latency is achieved on a system implemented on a four-way system board 201. Although the replacement of processor 102D with pass through 202 renders the system memory 104D inaccessible and non-functional, the reduced system memory capacity may be an acceptable compromise if it results in reduced overall memory latency.

It will be apparent to those skilled in the art having the benefit of this disclosure that the present invention contemplates a mechanism reducing the memory latency of a system by removing one of its processing devices. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A multiprocessor system, comprising:
   a set of processors;
   a system board having a set of sockets, each socket suitable for receiving one of the set of processors wherein the number of sockets in the set of sockets exceeds the number of processors in the set of processors;
   a set of interconnects providing point-to-point links between at least some of the sockets; and
   a pass through device occupying one of the set of sockets, wherein the pass through device connects a first interconnect link connected to the socket and a second interconnect link connected to the socket such that the first and second interconnect links form the functional equivalent of a single interconnect link.

2. The system of claim 1, wherein the system includes a local system memory corresponding to each processor, wherein the local memory of each processor is accessible to each of the other processors.

3. The system of claim 2, wherein the system is characterized by a two tiered memory latency wherein memory accesses to a processor's local memory is characterized by a first memory access latency while memory accesses to the system memory of any other processor are characterized by a second memory access latency.

4. The system of claim 1, wherein the number of sockets in the set of sockets exceeds the number of processors by at least one.

5. The system of claim 1, wherein the point-to-point links consist of power signals, ground signals, and a set of uni-directional data and command signals.

6. The system of claim 5, wherein the point-to-point links are further characterized as HyperTransport links.

7. The system of claim 1, wherein the set of processors include a first processor connected via corresponding instances of the point-to-point link to an I/O bridge, a second processor, and the pass through device.

8. The system of claim 7, wherein the set of processor include a second processor connected via corresponding instances of the point-to-point link to the pass through device and to a third processor.

9. The system of claim 8, wherein the third processor is further connected to the first processor via a corresponding instance of the point-to-point link.

10. A data processing system, comprising:
    a system board including a set of sockets suitable for receiving a corresponding set of processors and further including a first instance of an inter-chip link connecting a first socket of the set of sockets to a second socket and a second instance of an inter-chip link connecting the second socket to a third socket;
    a first processor inserted in the first processor socket;
    a second processor inserted in the third processor socket; and
    a pass through device inserted in the second socket, wherein the pass through device connects the first instance of the inter-chip link to the second instance of the inter-chip wherein the first processor is directly connected to the second processor via the first and second instances of the inter-chip link.

11. The system of claim 10, wherein each instance of the inter-chip link comprises a point-to-point link.

12. The system of claim 10, wherein the inter-chip link includes a set of uni-directional signals.

13. The system of claim 10, wherein the first processor is directly connected to a first system memory and the second processor is directly connected to a second system memory.

14. The system of claim 10, wherein the system board includes a set of four processor sockets and wherein three of the sockets are populated with processors and the pass through device populates a fourth socket.

15. The system of claim 10, wherein each of the set of processors is enabled to connect to three instances of the inter-chip link.

16. The system of claim 12, wherein the first and second instances of the inter-chip link comprise first and second instanced of a HyperTransport link.

17. The system of claim 13, wherein the system exhibits two tiered memory access latency in which access from a processor to its corresponding system memory is characterized by a first access latency and access by any processor to a system memory of any other processor is characterized by a second access latency.

* * * * *